(12) United States Patent
Meiser et al.

(10) Patent No.: US 9,530,884 B2
(45) Date of Patent: Dec. 27, 2016

(54) METHOD OF MANUFACTURING A SEMICONDUCTOR DEVICE AND SEMICONDUCTOR DEVICE

(71) Applicant: Infineon Technologies AG, Neubiberg (DE)

(72) Inventors: Andreas Meiser, Sauerlach (DE); Till Schloesser, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/868,909

(22) Filed: Sep. 29, 2015

(65) Prior Publication Data

US 2016/0093731 A1 Mar. 31, 2016

(30) Foreign Application Priority Data

Sep. 30, 2014 (DE) .................. 10 2014 114 184

(51) Int. Cl.
| | |
|---|---|
| *H01L 29/78* | (2006.01) |
| *H01L 29/40* | (2006.01) |
| *H01L 29/10* | (2006.01) |
| *H01L 29/417* | (2006.01) |
| *H01L 21/265* | (2006.01) |
| *H01L 29/66* | (2006.01) |

(52) U.S. Cl.
CPC ..... *H01L 29/7825* (2013.01); *H01L 21/26586* (2013.01); *H01L 29/1095* (2013.01); *H01L 29/407* (2013.01); *H01L 29/41766* (2013.01); *H01L 29/66696* (2013.01); *H01L 29/66704* (2013.01); *H01L 29/7835* (2013.01); *H01L 21/26513* (2013.01)

(58) Field of Classification Search
None
See application file for complete search history.

(56) References Cited

U.S. PATENT DOCUMENTS

| | | | | |
|---|---|---|---|---|
| 2006/0281249 | A1* | 12/2006 | Yilmaz | H01L 29/66727 438/243 |
| 2011/0233667 | A1* | 9/2011 | Tai | H01L 29/407 257/334 |
| 2011/0316075 | A1* | 12/2011 | Hsieh | H01L 29/66825 257/330 |
| 2012/0146090 | A1* | 6/2012 | Lui | H01L 29/8613 257/139 |
| 2012/0261746 | A1* | 10/2012 | Darwish | H01L 29/1095 257/330 |
| 2012/0292694 | A1* | 11/2012 | Hsieh | H01L 29/407 257/331 |

(Continued)

*Primary Examiner* — Evren Seven
(74) *Attorney, Agent, or Firm* — Baker Botts L.L.P.

(57) ABSTRACT

A method of manufacturing a semiconductor device including a transistor comprises forming field plate trenches in a main surface of a semiconductor substrate, a drift zone being defined between adjacent field plate trenches, forming a field dielectric layer in the field plate trenches, thereafter, forming gate trenches in the main surface of the semiconductor substrate, a channel region being defined between adjacent gate trenches, and forming a conductive material in at least some of the field plate trenches and in at least some of the gate trenches. The method further comprising forming a source region and forming a drain region in the main surface of the semiconductor substrate.

15 Claims, 11 Drawing Sheets

(56) References Cited

U.S. PATENT DOCUMENTS

| | | | | |
|---|---|---|---|---|
| 2012/0319199 A1* | 12/2012 | Zeng | H01L 29/407 | 257/334 |
| 2012/0326227 A1* | 12/2012 | Burke | H01L 29/407 | 257/330 |
| 2013/0221436 A1* | 8/2013 | Hossain | H01L 29/407 | 257/334 |
| 2014/0097863 A1* | 4/2014 | Zundel | H01L 22/34 | 324/762.01 |
| 2014/0151798 A1* | 6/2014 | Meiser | H01L 29/7816 | 257/339 |
| 2014/0217495 A1* | 8/2014 | Wutte | H01L 29/407 | 257/328 |
| 2015/0076590 A1* | 3/2015 | Meiser | H01L 29/66734 | 257/330 |
| 2015/0091088 A1* | 4/2015 | Vielemeyer | H01L 29/7816 | 257/337 |
| 2015/0102404 A1* | 4/2015 | Meiser | H01L 29/4236 | 257/334 |
| 2015/0137224 A1* | 5/2015 | Meiser | H01L 29/4175 | 257/331 |
| 2015/0187761 A1* | 7/2015 | Irsigler | H01L 21/225 | 257/334 |
| 2015/0279978 A1* | 10/2015 | Meiser | H01L 29/0657 | 257/586 |
| 2016/0093728 A1* | 3/2016 | Decker | H01L 29/7813 | 257/330 |

\* cited by examiner

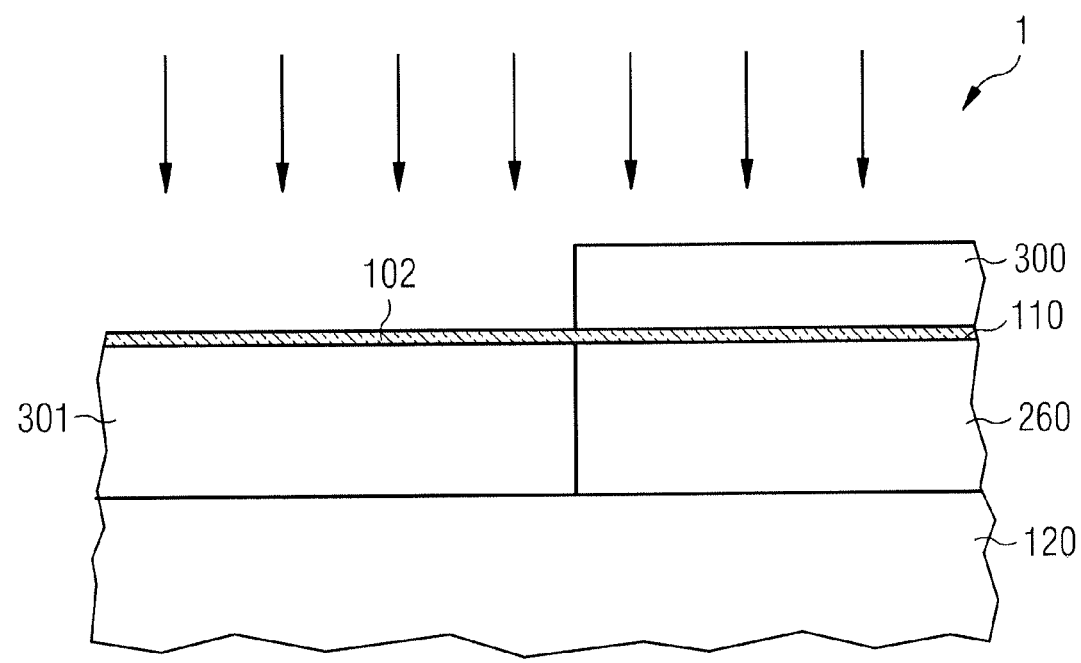

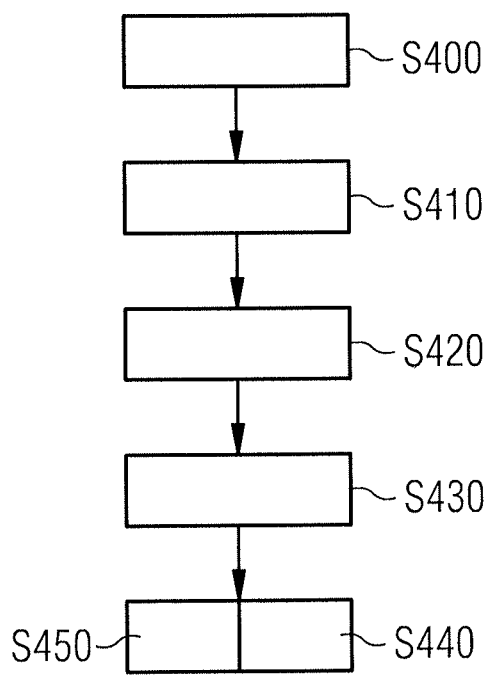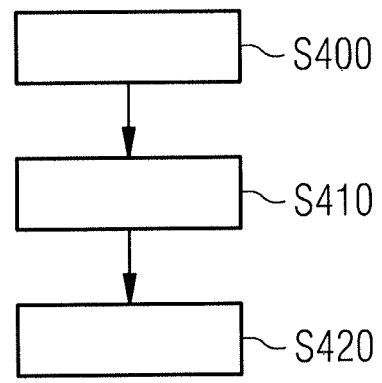

US 9,530,884 B2

METHOD OF MANUFACTURING A SEMICONDUCTOR DEVICE AND SEMICONDUCTOR DEVICE

CROSS REFERENCE TO RELATED APPLICATION

This application claims priority to German Application Serial No. 102014114183.9 filed Sep. 30, 2014 and entitled "Method of Manufacturing a Semiconductor Device and Semiconductor Device".

TECHNICAL FIELD

The present specification relates to a method of manufacturing a semiconductor device and a semiconductor device.

BACKGROUND

MOS power transistors or MOS power devices which are commonly employed in automotive and industrial electronics, should have a low on-state resistance ($R_{on}$). In an off-state, a high breakdown voltage is desirable to withstand source-drain voltages. For example, typical MOS power transistors should withstand a drain to source voltage $V_{ds}$ of some tens to some hundreds volts when being switched off. As a further example, MOS power transistors conduct a very large current which may be up to some hundreds of amperes at a gate-source voltage of about 2 to 20 V and at a low voltage drop $V_{ds}$.

According to commonly employed technologies, lateral MOS transistors are used, which comprise a drain extension region or which are based on the so-called resurf concept. According to the resurf concept, in an off-state charges are removed by a doped portion which is disposed beneath the drift region. Alternatively, this doped portion may be implemented as an electrode disposed over the drift region and being insulated from the drift region. In order to further reduce the $R_{on}$ and the parasitic capacitances, new concepts for implementing a transistor are being searched for. Further, novel methods for manufacturing such a transistor are being developed.

SUMMARY

According to an embodiment, a method of manufacturing a semiconductor device including a transistor comprises forming field plate trenches in a main surface of a semiconductor substrate, a drift zone being defined between adjacent field plate trenches. The method further comprises forming a field dielectric layer in the field plate trenches, and thereafter, forming gate trenches in the main surface of the semiconductor substrate, a channel region being defined between adjacent gate trenches. The method further comprises forming a conductive material in at least some of the field plate trenches and in at least some of the gate trenches. The method further comprises forming a source region and forming a drain region in the main surface of the semiconductor substrate.

According to another embodiment, a method of manufacturing a semiconductor device including a transistor comprises forming field plate trenches in a main surface of a semiconductor substrate, a drift zone being defined between adjacent field plate trenches. The method further comprises forming a field dielectric layer in the field plate trenches, and thereafter, forming gate trenches in the main surface of the semiconductor substrate, a channel region being defined between adjacent gate trenches. The method further comprises forming a conductive material in at least some of the field plate trenches and in at least some of the gate trenches, wherein each of the field plate trenches and each of the gate trenches is formed to extend in the first horizontal direction, adjacent ones of the field plate trenches and of the gate trenches being disposed along a second horizontal direction perpendicular to the first direction.

According to another embodiment, a semiconductor device comprising a transistor includes field plate trenches in a main surface of a semiconductor substrate, a drift zone being defined between adjacent field plate trenches. A dielectric layer is at sidewalls of the field plate trenches. Gate trenches are in the main surface of the semiconductor substrate. A channel region is defined between adjacent gate trenches. A conductive material is in at least some of the field plate trenches and in at least some of the gate trenches. The channel region is defined in the semiconductor substrate between adjacent gate trenches. The dielectric layer is disposed over an upper surface of the channel region. The semiconductor device further comprises a source region and a drain region in the main surface.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 3A to 3C illustrate modifications of the manufacturing method;

FIG. 4A illustrates a general method according to an embodiment; and

FIG. 4B illustrates a general method according to a further embodiment.

DETAILED DESCRIPTION

Figure 1A:
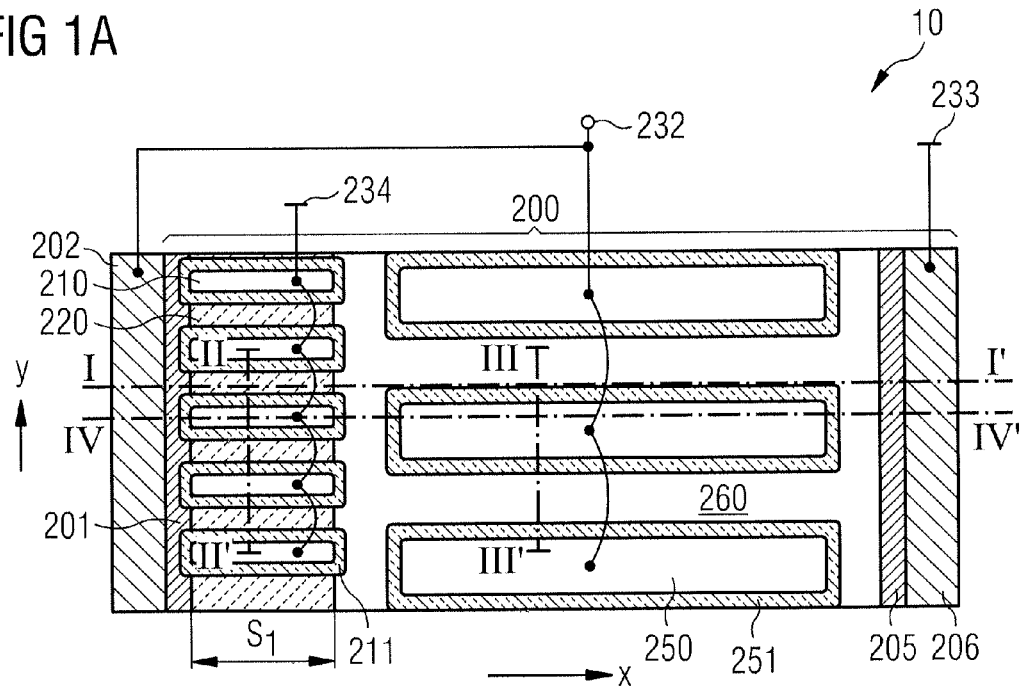
FIG. 1A shows a plan view of an example of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Figure 1B:
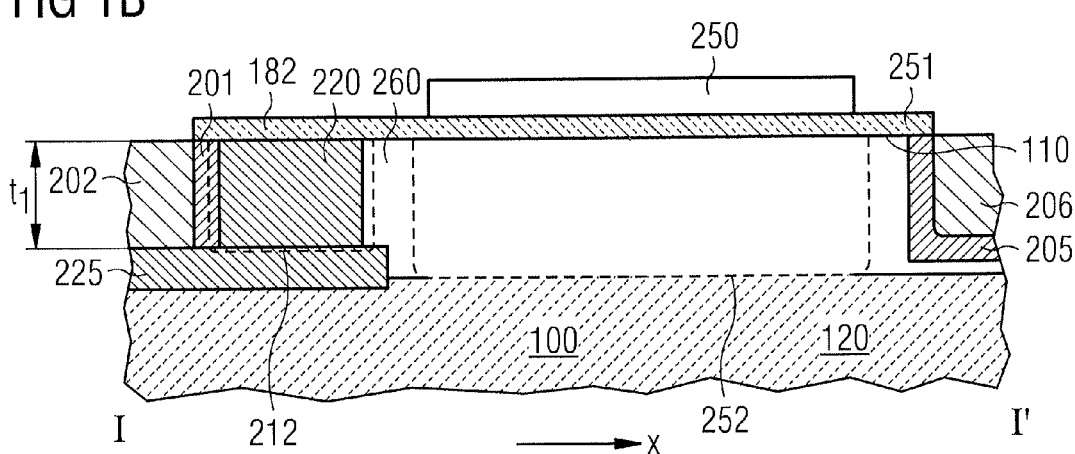
FIG. 1B shows a cross-sectional view of the semiconductor device shown in FIG. 1A.

FIG. 1A shows a plan view of a semiconductor device 10 according to an embodiment, and FIG. 1B shows a cross-sectional view of the semiconductor device along the line I-I'.

The semiconductor device shown in FIGS. 1A to 1E comprises a source region 201, a drain region 205, a channel region 220, and a drift zone 260. The source region 201, the drain region 205, and the drift zone 260 may be doped with dopants of a first conductivity type, for example n-type dopants. The doping concentration of the source and drain region 201, 205 may be higher than a doping concentration of the drift zone 260. The channel region 220 is arranged between the source region 201 and the drift zone 260. The channel region 220 is doped with dopants of a second conductivity type, for example, p-type dopants. The drift zone 260 may be arranged between the channel region 220 and the drain region 205. The source region 201, the channel region 220, the drift zone 260 and the drain region 205 are disposed along a first horizontal direction, e.g. the x-direction.

When a suitable voltage is applied to the gate electrode 210, the conductivity of a channel that is formed in the channel region 220 will be controlled by the gate voltage. The gate electrode 210 is insulated from the channel region 220 by means of an insulating gate dielectric material 211 such as silicon oxide. By controlling the conductivity of a channel formed in the channel region 220, the current flow from the source region 201 via the channel formed in the channel region 220 and the drift zone 260 to the drain region 205 may be controlled.

The source region 201 is connected to a source contact 202, e.g. a source electrode. The drain region 205 is connected to a drain contact 206, e.g. a drain electrode. The source contact 202 may be electrically connected to a source terminal 232. The drain contact 206 may be electrically connected to a drain terminal 233.

The arrangement shown in FIG. 1A implements a semiconductor device 1 comprising a transistor 200 that is formed in a semiconductor substrate 100 having a first main surface 110. The transistor 200 further comprises a field plate 250 which is arranged adjacent to the drift zone 260. The field plate 250 is insulated from the drift zone 260 by means of an insulating field dielectric layer 251 such as a field oxide. The field plate may be electrically coupled to a suitable terminal, e.g. the source terminal 232.

When being switched on, e.g. by applying a suitable voltage to the gate electrode 210, an inversion layer is formed at the boundary between the channel region 220 and the insulating gate dielectric material 211. Accordingly, the transistor 200 is in a conducting state from the source region 201 to the drain region 205 via the drift zone 260. When the transistor 200 is switched off, no conductive channel is formed at the boundary between the channel region 220 and the insulating gate dielectric material 211 so that no current flows. In an off-state, the field plate 250 depletes charge carriers from the drift zone 260 so that the blocking voltage characteristics of the semiconductor device are improved. In a semiconductor device comprising a field plate, the doping concentration of the drift zone 260 may be increased without deteriorating the blocking voltage characteristics in comparison to a device without a field plate. Due to the higher doping concentration of the drift zone 260, the on-resistance $Rds_{on}$ is further decreased resulting in improved device characteristics.

As is illustrated in FIG. 1A, a plurality of single transistor cells are connected in parallel. In more detail, the source regions 201 of the transistor cells are formed as a common source region and are electrically connected to a source terminal 232. The drain regions 205 of the transistor cells are formed as a common drain region and are electrically connected to a drain terminal 233. Further, the single gate electrodes 210 are electrically connected to a gate terminal 234.

FIG. 1B shows a cross-sectional view of the semiconductor device 1 illustrated in FIG. 1A between I and I'. The direction between I and I' corresponds to the first direction. As is shown, the source region 201 extends from the main surface 110 into a depth direction of the substrate 100, i.e. perpendicularly with respect to the main surface 110. The channel region 220 and the drift zone 260 are disposed along a first direction which is parallel to the first main surface 110 between the source region 201 and the drain region 205. The drain region 205 likewise extends from the first main surface 110 in a depth direction of the substrate. As is indicated by dotted lines, in a plane before and behind the depicted plane of the drawing, gate trenches 212 are disposed adjacent to the channel region 220. In a corresponding manner, field plate trenches 252 may be disposed adjacent to the drift zone 260. The gate trench 212 and the field plate trench 252 extend from the first main surface 110 in a depth direction of the substrate. As a consequence, the channel region 220 has the shape of a first ridge or fin. Due to the presence of the field plate trenches 252, also the drift zone 260 has the shape of a second ridge. FIG. 1B further shows a body connection portion 225 that is disposed beneath the body region 220 and which may be disposed beneath a part of the drift zone 260. The body connection portion 225 connects the channel region 220 to the source contact 202 so as to avoid a parasitic bipolar transistor which could be otherwise formed at this portion. Moreover, the body connection portion 225 extends beneath the drift zone 260 so that in an off-state of the transistor 200, the drift zone 260 may be depleted more easily.

As becomes apparent from FIGS. 1A and 1B, a semiconductor device comprises a transistor. The transistor comprises field plate trenches 252 in a main surface 110 of a semiconductor substrate 100. A drift zone 260 is defined between adjacent field plate trenches 252. The transistor further comprises a field dielectric layer 251 at sidewalls of the field plate trenches 252, and gate trenches 212 in the main surface 110 of the semiconductor substrate 100. A channel region 220 is defined between adjacent gate trenches 212. The transistor further comprises a conductive material 170 in at least some of the field plate trenches 252 and in at least some of the gate trenches 212, wherein the channel region 220 is defined in the semiconductor substrate 100 between adjacent gate trenches 212 and the field dielectric layer 251 being disposed over an upper surface of the channel region 220a. The semiconductor device further comprises a source region 201 and a drain region 205 in the main surface 110. For example, the transistor may further comprise a gate dielectric layer 211 at sidewalls of the gate trenches 212. The field dielectric layer 251 may have a larger thickness than the gate dielectric layer 211.

The semiconductor device may further comprise a source region 201 and a source contact 202 in contact with the source region 201, the source contact 202 being disposed in a contact groove 203 in the main surface 110. The contact groove 203 and the gate trenches 212 may extend to approximately the same depth. Each of the field plate trenches 252 and each of the gate trenches 212 may extend in a first horizontal direction, e.g. the x-direction. Further, the field plate trenches may be arranged so that adjacent ones of the field plate trenches are disposed along a second horizontal direction, e.g. the y-direction, perpendicular to the first direction. Moreover, the gate trenches 212 may be arranged so that adjacent ones of the gate trenches 212 are disposed along the second horizontal direction.

Figure 1C:
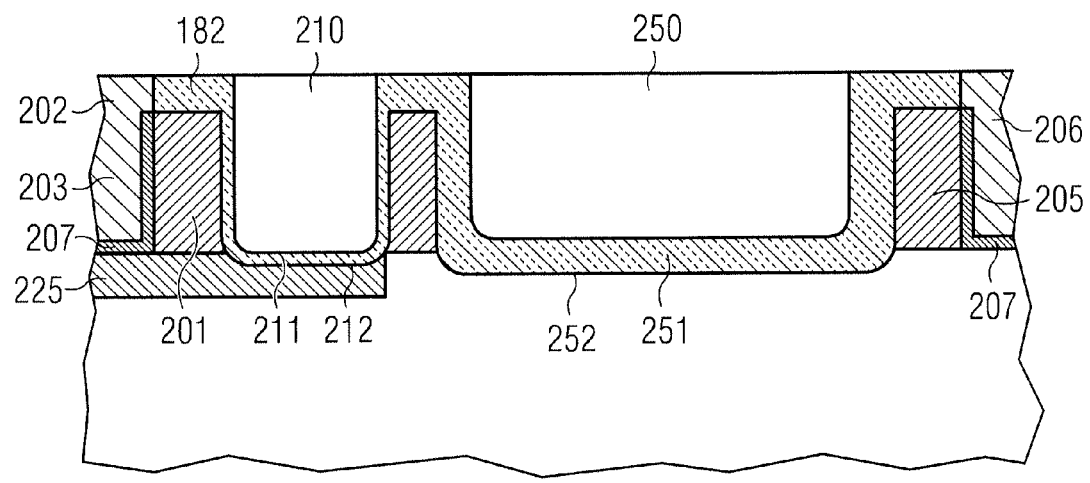
FIG. 1C shows a further cross-sectional view of the semiconductor device shown in FIG. 1A.

FIG. 1C shows a cross-sectional view of the semiconductor device along the first direction along the line IV-IV', as shown in FIG. 1A. This cross-sectional view is taken so as to intersect the gate trench 212 and the field plate trench 252. As is shown, a gate dielectric layer 211 lines the bottom side and the sidewalls of the gate trenches 212. The gate dielectric layer 211 has a smaller thickness than the field dielectric layer 251. A portion of the dielectric layer implementing the field dielectric layer 251 is disposed over the source region 182. The contact groove 203 in which the source contact 202 is disposed extends to the same depth as the gate trench 212.

Figure 1D:
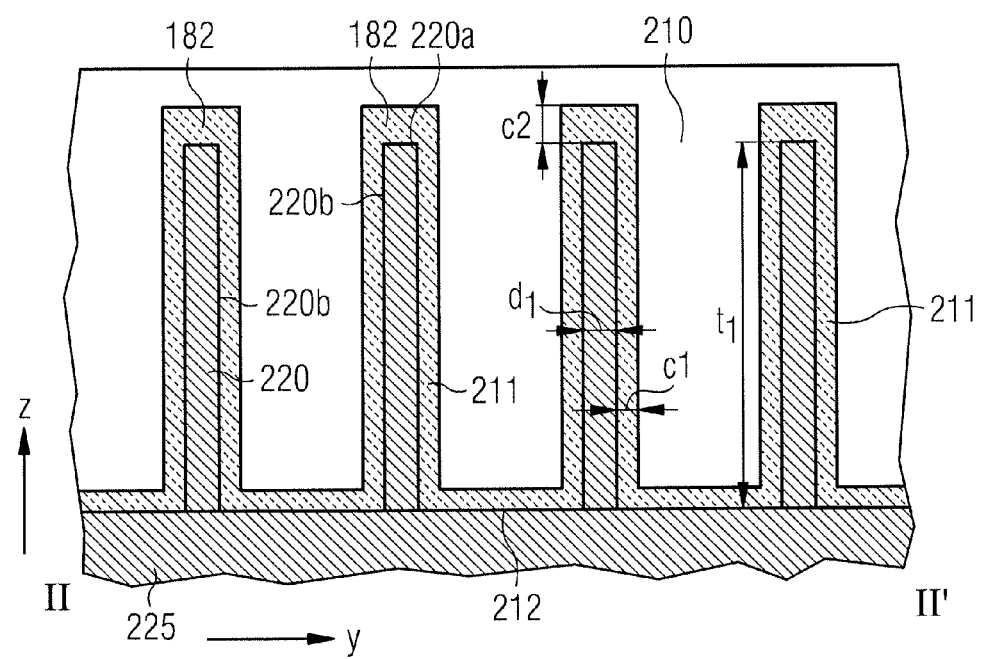
FIG. 1D shows a cross-sectional view of the semiconductor device according to an embodiment, taken along a direction perpendicular to the direction along which the cross-sectional view of FIG. 1B is taken.
Figure 1E:
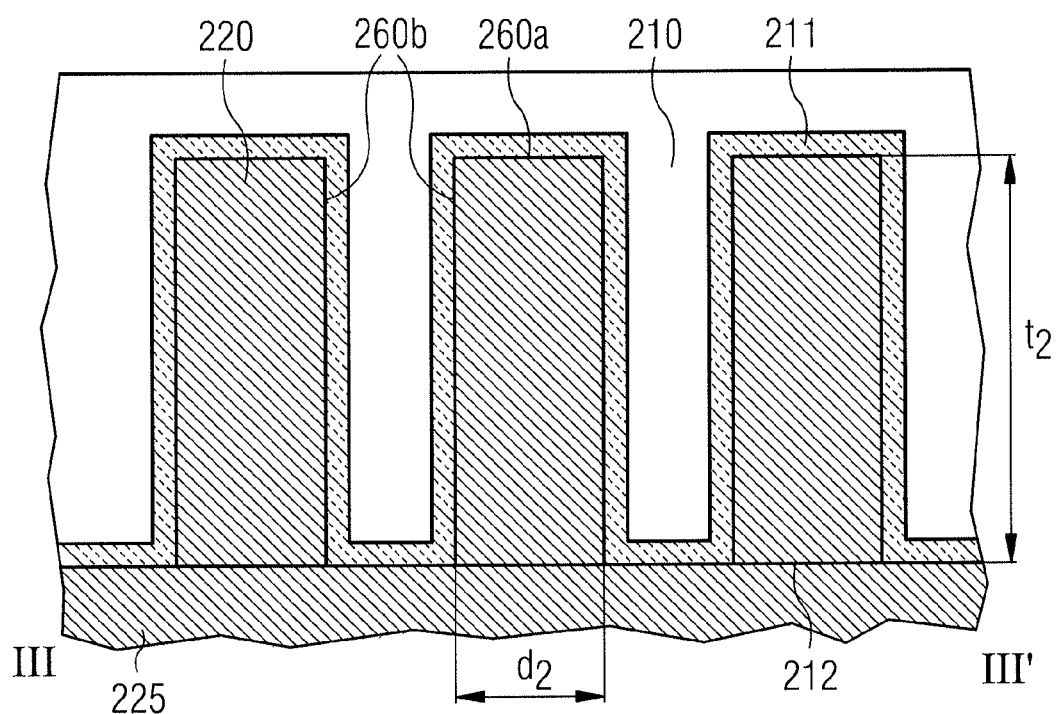
FIG. 1E shows a further cross-sectional view of the semiconductor device, taken along a direction perpendicular to the direction along which the cross-sectional view of FIG. 1B is taken.

FIGS. 1D and 1E illustrate cross-sectional views of the substrate which are taken along the lines II-II' and III-III' in FIG. 1A. The directions between II and II' and between III and III' are perpendicular to the first direction and may extend along the y-direction. As is shown in FIG. 1D, the channel region 220 has the shape of a ridge or a fin, the ridge having a width $d_1$ and a depth or height $t_1$. For example, the first ridge may have a top side 220a and two sidewalls 220b. The sidewalls 220b may extend perpendicularly or at an angle of more than 75° with respect to the first main surface 110. The gate electrode 210 may be disposed adjacent to at least two sides of the ridge. According to further embodiments, one of the gate trenches 212 may be filled with an insulating material.

As is shown in FIG. 1D, the dielectric layer 182 forming the field dielectric layer 251 is disposed adjacent to a top side 220a of the first ridge. The gate dielectric layer 211 is disposed at the sidewalls 220b of the first ridge. The gate dielectric layer 211 has a smaller thickness c1 than the thickness c2 of the dielectric layer 182 at the top side 220a. The respective thicknesses are measured along the shortest distance between the channel region 220 and the gate electrode 210. In the example illustrated in FIG. 1D, the thickness c1 of the gate dielectric layer is measured along the y-direction and the thickness c2 is measured along the z-direction. Accordingly, when applying a suitable voltage to the gate electrode 210, a conductive inversion layer is formed at a sidewall 220b of the ridge, whereas no conductive inversion layer is formed at the top side 220a of the ridge. Thereby, a current flow may be better controlled.

Moreover, as is illustrated in FIG. 1E, in a cross-sectional view between III and III', the drift zone 260 also has the shape of a second ridge, the second ridge having a width $d_2$ and a depth or height $t_2$. For example, the second ridge may have a top side 260a and two sidewalls 260b. The sidewalls 260b may extend perpendicularly or at an angle of more than 75° with respect to the first main surface 110. The drift zone 260 may be disposed adjacent to the top side 260a or adjacent to at least two sides of the ridge.

The deep body connection portion 225 is disposed beneath each of the ridges. A gate dielectric layer 211 is disposed between the gate electrode 210 and the channel region 220. In a similar manner, the field dielectric layer 251 is disposed between the field plate 250 and the drift zone 260.

According to an embodiment, the width $d_1$ of the channel region 220 is: $d_1 \leq 2 \times l_d$, wherein $l_d$ denotes a length of a depletion zone which is formed at the interface between the gate dielectric layer 211 and the channel region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material ($11.9 * \varepsilon_0$ for silicon), k denotes the Boltzmann constant ($1.38066 * 10^{-23}$ J/K), T denotes the temperature which may correspond to a usual ambient temperature, e.g. −5 to 30° C., more specifically, 10 to 25° C., ln denotes the natural logarithm, $N_A$ denotes the impurity concentration of the semiconductor body, $n_i$ denotes the intrinsic carrier concentration ($1.45*10^{10}$ for silicon at 27° C.), q denotes the elementary charge ($1.6*10^{-19}$ C).

Generally, it is assumed that in a transistor, the length of the depletion zone at a gate voltage corresponding to the threshold voltage corresponds to the maximum width of the depletion zone. For example, the width of the first trenches may be approximately 20-130 nm, for example, 40-120 nm along the first main surface 110 of the semiconductor substrate 100.

According to a further interpretation, a distance between adjacent gate trenches 212 measured along a second direction perpendicular to the first direction may fulfill the above formula and may be less than $2 \times l_d$.

Moreover, the ratio of length to width may fulfill the following relationship: $s_1/d_1 > 2.0$, wherein $s_1$ denotes the length of the ridge measured along the first direction, as is also illustrated in FIG. 1A. According to further embodiments, $s_1/d_1 > 2.5$. As is shown in FIGS. 1D and 1E, the width $d_1$ of the channel region 220 may be different from the width $d_2$ of the drift zone 260.

According to the embodiment in which the width $d_1 \leq 2 \times l_d$, the transistor 200 is a so-called "fully depleted" transistor in which the channel region 220 is fully depleted when the gate electrode is set to an on-potential. In such a transistor, an optimal sub-threshold voltage can be achieved and short channel effects may be efficiently suppressed, resulting in improved device characteristics.

In a transistor comprising a field plate, on the other hand, it is desirable to use a drift zone 260 having a width $d_2$ which is much larger than the width $d_1$. Due to the larger width of the drift zone $d_2$, the resistance $Rds_{on}$ of the drift zone 260 may be further decreased, resulting in further improved device characteristics. In order to improve the characteristics of the semiconductor device in the body region 220 and to further improve the device characteristics in the drift zone 260, patterning the gate electrode and the field plate 250 is accomplished so as to provide a different width of the first and second ridges.

As has further been discussed with reference to FIG. 1B, the source and the drain region 201, 205 extend in the depth direction of the substrate. Accordingly, by appropriately setting the depth of the source and drain region 201, 205, the electric properties of the transistors may be set in accordance with the requirements. Due to the special additional feature that the gate electrode 210 and the field plate 250 extend in the depth direction adjacent to the channel region 220 and the drift zone 260, it is possible to control the conductivity of a channel that is formed in the channel region 220 by means of the gate electrode along the full depth $t_1$ of the channel region 220. In a corresponding manner, the field plate 250 influences the behavior of the drift zone 260 along the depth $t_2$ of the second ridge. Therefore, the depth of the source region 201 and the drain region 205 determine the effective width of the transistor 200. By setting the depth of the source and the drain regions 201, 205 the width and, consequently, the characteristics of the device may be determined. For example, the depth of the source and the drain regions 201, 205 may be larger than 1 μm.

Generally, when being operated in an on-state, a conductive inversion layer is formed in the channel region 220 adjacent to the gate dielectric layer 211. According to an embodiment, the inversion layer extends along at least one of the two sidewalls 220b and 220a current flows mostly parallel to the first main surface 110.

As is illustrated in FIGS. 1O and 1E, the gate electrode may be disposed at at least two sides of the ridge. According to a further embodiment, the gate electrode may be disposed along the two vertical sides of the ridge, whereas no gate electrode is disposed adjacent to the horizontal portion of the ridge or is shielded by a thicker dielectric layer. In a similar manner, the field plate 250 may be disposed at three sides of the drift zone 260. Nevertheless, according to an embodiment, the field plate 250 may be disposed adjacent to only the vertical portions of the drift zone 260. According to the embodiment shown in FIG. 1, the gate electrode 210 and the field plate 250 are separated from each other.

According to an embodiment, the doping concentration within the drift zone 260 may be constant. According to a further embodiment, the doping concentration may increase with increasing distance from the source region 201. Further, the thickness of the gate dielectric layer 211 may be less than a thickness of the field plate dielectric layer 251. The thickness of the field plate dielectric layer 251 may be constant or may increase with increasing distance from the source region 201. Moreover, the thickness of the field plate dielectric layer 251 adjacent to the horizontal surface of the ridge may be different from a thickness of the field plate dielectric layer 251 adjacent to a vertical portion of the ridge. For example, the thickness of the vertical portion of the field plate dielectric layer 251 may be smaller than a horizontal portion of the field plate dielectric layer 251. The semiconductor device shown in FIG. 1 may further comprise contacts which extend to the first main surface 110 of the semiconductor substrate 100. According to a further embodiment, the semiconductor device may further comprise contacts to a second main surface which is opposite to the first main surface 110 of the semiconductor substrate 100. According to an embodiment, the source contact 202 that is electrically coupled to the source region 201, may extend to the first main surface 110 and the drain contact 206 that is electrically coupled to the drain region 205, may extend to the second main surface being opposite to the first main surface 110.

FIGS. 2A to 2J illustrate cross-sectional view of a semiconductor work piece 1 when performing the method according to an embodiment.

A semiconductor substrate may be pre-processed by performing isolation processes and implantation steps which are generally known. For example, a deep trench isolation (DTI) process or a pn isolation process may be performed, optionally, further a shallow trench isolation (STI) process may be performed. In addition, a well implantation step may be performed so as to form a well implantation portion 120. A thin silicon oxide layer 102 may be formed over a main surface 110 of the semiconductor substrate 100. Further, an implantation step S100 may be performed so as to define the drift zone 260. In the embodiment shown in FIG. 2A, the drift zone 260 is n-doped and the well implantation portion 120 is slightly n-doped.

Further implantation steps may be performed and annealing steps may be performed. A further oxidation step may be performed. Thereafter, a hard mask layer may be formed over the resulting substrate surface. For example, the hard mask may be a hard mask layer stack comprising several layers as is generally known.

Thereafter, field plate trenches 252 may be photolithographically defined. For example, the trenches may have a depth of approximately 500 to 5000 nm and the distance between adjacent field plate trenches 252 in a direction perpendicular to the shown cross-section (y-direction) may be 200 to 2000 nm. The width of the field plate trenches measured in a direction perpendicular to the shown cross-section, e.g. the y-direction, may be approximately 300 to 800 nm. After etching the field plate trenches, the hard mask residues may be removed and a dielectric layer 182 may be formed. For example, the dielectric layer 182 may be a silicon oxide layer and may be formed by a low pressure CVD method using tetraethylorthosilicate (TEOS) as a precursor material. For example, the dielectric layer 182 may have a thickness of 30 to 500 nm, e.g. 150 to 300 nm, e.g. 200 nm. Portions of the dielectric layer 182 will form the field dielectric layer 251 which is disposed between the field plate (to be formed later) and the adjacent semiconductor material.

Figure 2A:
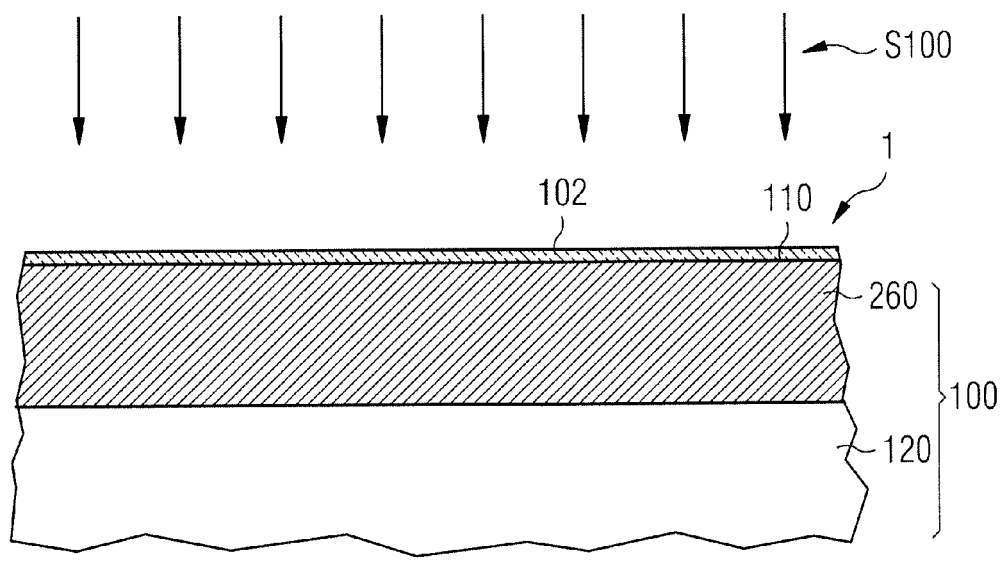
FIGS. 2A to 2J show cross-sectional views of a semiconductor substrate while performing processing methods of a manufacturing method.
Figure 2B:
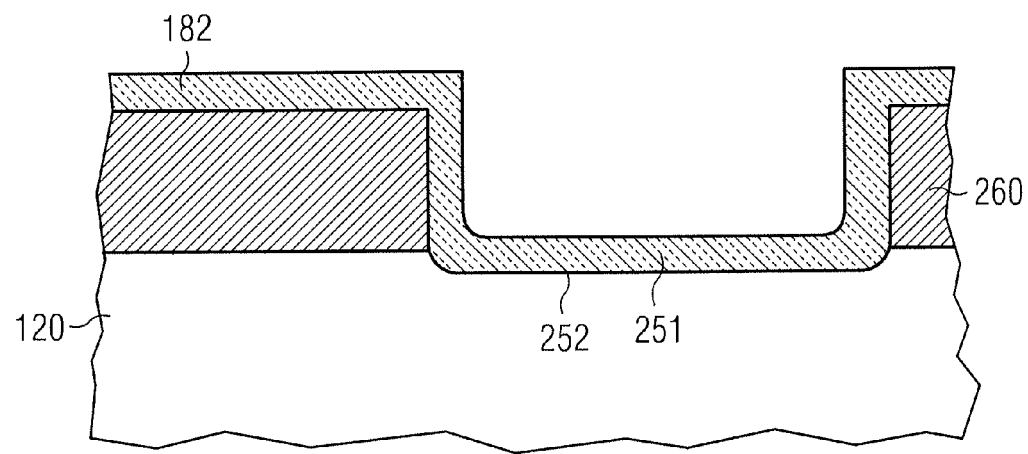

FIG. 2B shows a cross-sectional view of an example of a resulting structure along the extension length of the field plate trenches 251. The field plate trenches 252 may segment the drift zone 260 into ridges. By setting the distance between adjacent field plate trenches 252, the width of the ridges of the drift zone 260 may be set.

Thereafter, a further hard mask layer stack is formed over the resulting structure and patterned. For example, the hard mask layer stack may comprise a carbon hard mask 103 which is grown over the field plate trench 252 and an amorphous silicon layer which may be thinner than the carbon layer 103. Then, a further photolithographic step is performed for defining the gate trenches 212, the contact groove 203 for contacting the source region and, optionally, the contact groove 204 for contacting the drain region. During these etching processes, the hard mask comprising the amorphous silicon layer and the carbon hard mask layer is patterned followed by etching the dielectric layer 182 and the silicon material. For example, the gate trenches may have a depth of approximately 500 to 5000 nm. The distance between adjacent gate trenches 212 may be 30 to 300 nm, the distance being measured perpendicular to the extension direction of the gate trenches, e.g. along the y-direction. The gate trenches 212 may have a distance which is smaller than the distance between adjacent field plate trenches 252. The gate trenches 212 may be etched to a similar depth as the field plate trenches 252.

Figure 2C:
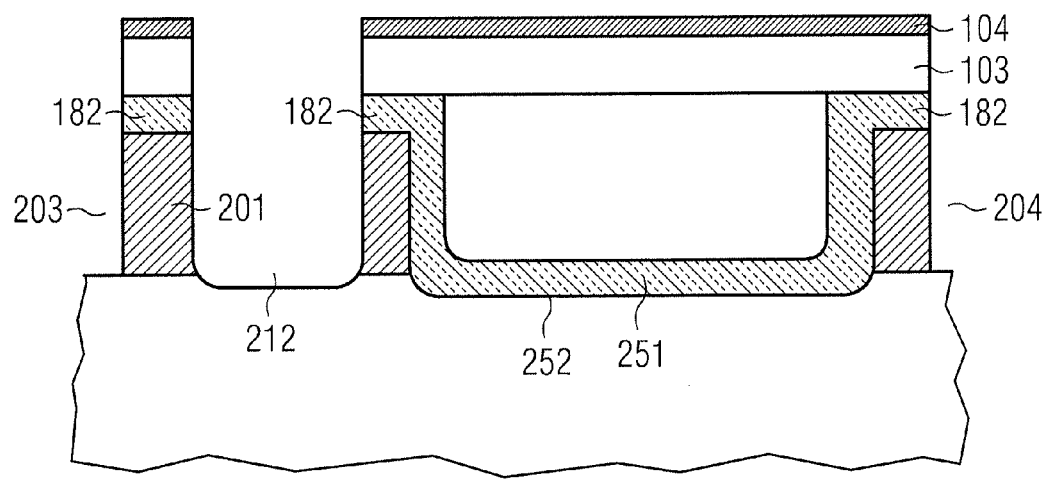

FIG. 2C shows an example of a resulting structure. As is shown, gate trenches 212, the source contact groove 203 and the drain contact groove 204 are formed in the semiconductor substrate 100. The source contact groove 203 extends along the y-direction. The depth of the source contact groove 203 is approximately equal to the depth of the gate trenches 212. Further, the depth of the drain contact groove 204 may be equal to the depth of the source contact groove 203. Since the source contact groove 203 and, optionally, the drain contact groove 204 are etched when etching the gate trench 212, the gate electrode 210, the source contact 202, and, optionally, the drain contact 206 may be formed in a self-aligned manner. Since the gate trench 212, the source contact groove 203 and, optionally, the drain contact groove 204 have approximately the same depth, the width of the resulting transistor may be set and, hence, the characteristics of the transistor may be determined.

The dielectric layer 182 is still present over the portion which will define the source region 201 and over the portion which will define the drain region 202. Although not shown in this cross-sectional view, the gate trenches 212 pattern the substrate into ridges or fins and the dielectric layer 182 still is present over the ridges. Thereafter, the hard mask layer are removed.

In the next step, a gate oxide layer 211 is formed in the gate trenches 212. For example, this may be accomplished by a thermal oxidation. The gate dielectric layer 211 may have a thickness of 5 to 50 nm. During this step, also a silicon oxide layer 181 is formed to cover the bottom side and the sidewalls of the contact grooves 203 and 204. Then, a conductive material 170 is formed to fill the trenches and grooves. For example, polysilicon may be deposited. For example, the polysilicon layer may have a thickness of 50 to 300 nm. The polysilicon material may be n-doped or may be undoped and may be doped after deposition. Then, the conductive material 170 is patterned so as to form the gate electrode 210 and the field plate 250. Further, the conductive material 170 fills the contact grooves 203, 204. Thereafter, residues of the photoresist material are removed.

Figure 2D:
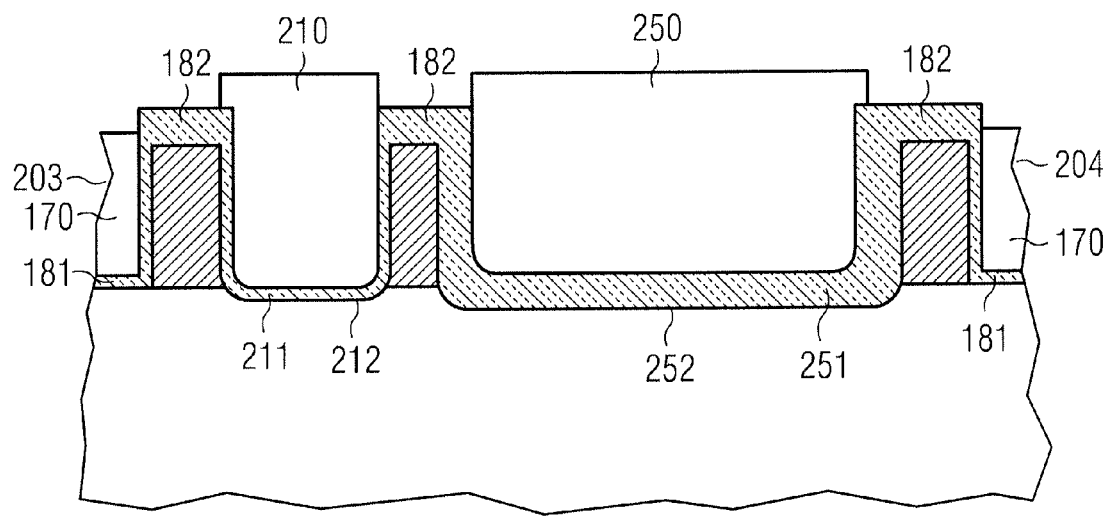

FIG. 2D shows an example of a resulting structure. As is shown, the contact grooves 203 and 204 are filled with a conductive material 170 and are insulated by means of the thin oxide layer 181. Further, the gate electrode 210 and the field plate 250 are disposed in the gate trench 212 and the field plate trench 252, respectively. In the next step, further hard mask layers may be deposited. For example, first a, silicon nitride liner layer 171 may be conformally formed over the resulting structure. Then, a silicon oxide layer 172 may be formed, followed by a chemical-mechanical polishing (CMP) step, which may stop on silicon nitride, for planarizing the surface. Finally, a photoresist layer 173 may be formed and may be patterned. The hard mask layer stack may be patterned so as to expose the surface of the source contact groove 203 and, optionally, of the drain contact groove 204. Then, an angled implantation step with n-type dopants may be performed so as to define the source region 201 and the drain region 205. For example, phosphorus may be used as a dopant. Optionally, the angled implantation step may be performed using a mask.

Figure 2E:
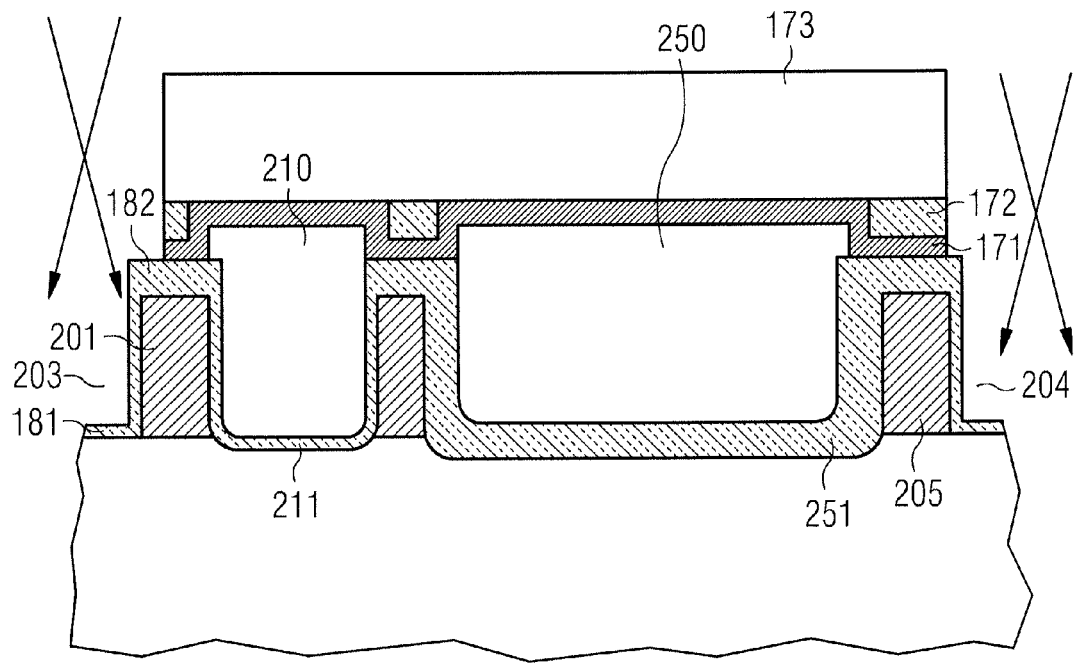

FIG. 2E shows an example of a resulting structure. Thereafter, after removing residues of the photoresist material, doping processes with p-type dopants to define the body region and the body contact portion 225 may be performed. For example, this may be accomplished by an angled implantation step into the sidewalls of the source region 201. Further, the bottom of the trench 203 may be implanted at a higher dose so as to define the connection portion 226.

Figure 2F:
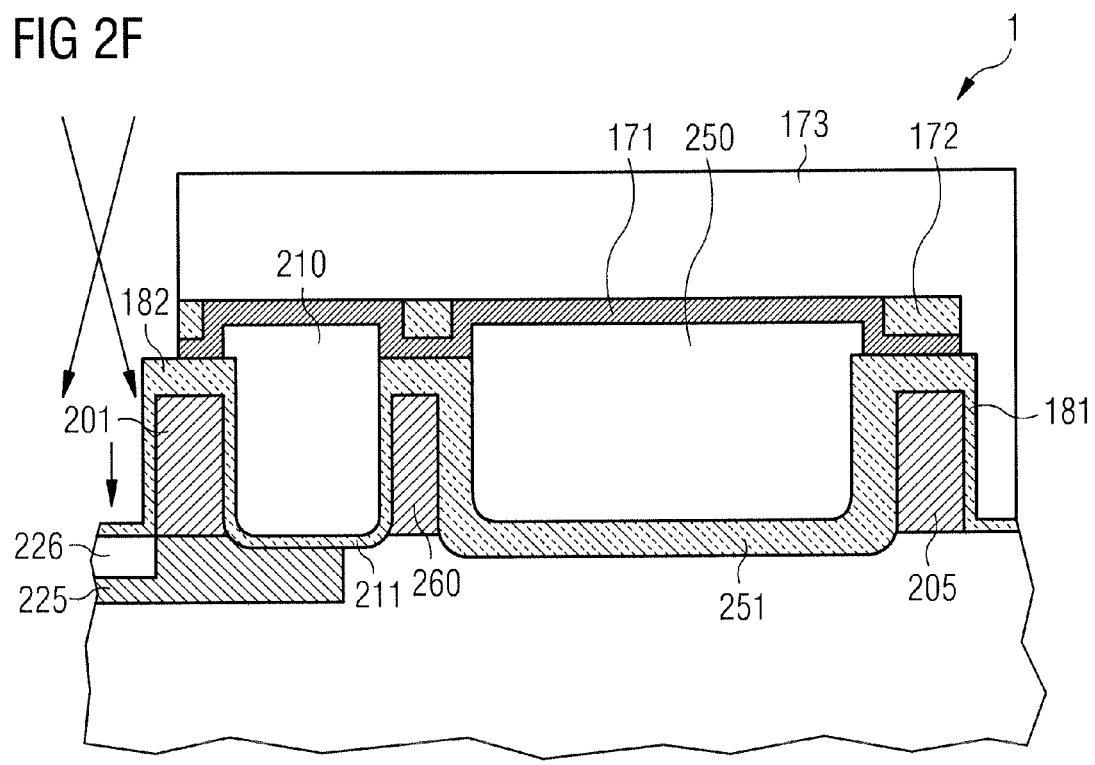
Figure 2G:
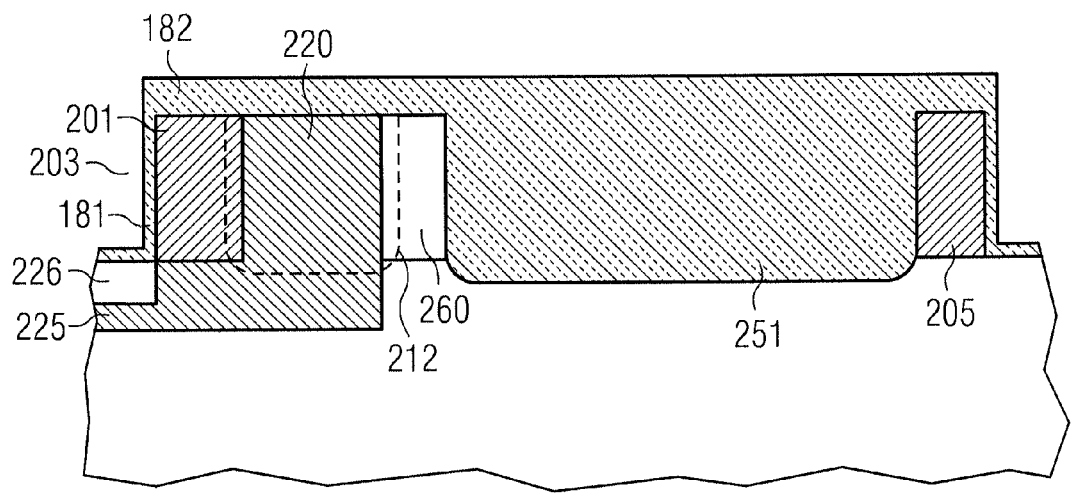

FIGS. 2F and 2G show cross-sectional views of a resulting structure. These sectional views are taken at different positions. The sectional view of FIG. 2F is taken along the line IV-IV' (cf. FIG. 1A) and cuts through the gate electrode 210, whereas the sectional view of FIG. 2G is taken along the line I-I' (cf. FIG. 1A) which cuts through the body region 220. As is illustrated in FIG. 2F, the body contact portion 225 is disposed beneath the source contact groove 203 and the channel region 220. A connection portion 226 is disposed at the bottom of the contact groove 203 in contact with the body contact region 225. As is specifically illustrated in FIG. 2G, the channel region 220 is disposed between the source region 201 and the adjacent drift zone 260. The thicker silicon oxide layer 182 is disposed over the channel region 220 and over the source region 201. Accordingly, a smooth surface is formed in the sectional view shown in FIG. 2G.

According to an alternative implementation, first the channel region 220 and thereafter the source region 201 and the drain region 205 may be doped. Further, additional anneals may be performed so as to optimize the device performance. For example, first the p-type dopants, e.g. boron may be implanted into the groove sidewall. Then, an annealing step may be performed, followed by a further implantation step for implanting the n-type dopants, e.g. phosphorous. Thereafter, a further annealing step is performed. Due to the different diffusion constants of boron and phosphorous, the boron ions and the phosphorous ions will move to the portions for defining the channel regions 220 and the source region 201.

Figure 2H:
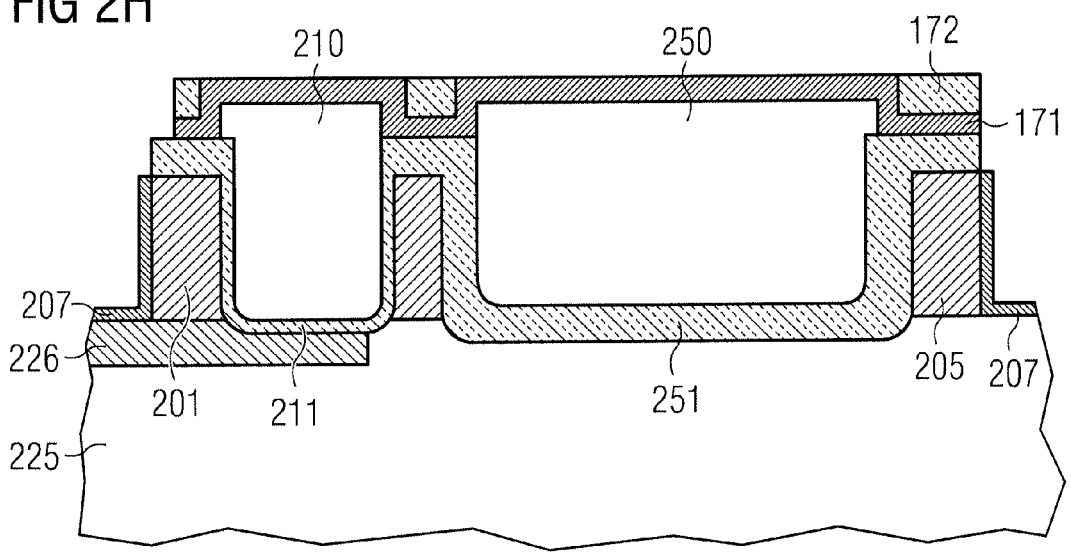

Thereafter, the contacts for contacting the source region 201 and the drain region 205 will be formed. First, the residues of the resist layer 173 are removed from the work piece 1. Then, a titanium layer 207 may be deposited over the resulting surface, followed by an annealing step. During this annealing step, titan silicide (TiSi) is formed at the interface between the titanium layer 207 and the silicon material. Thereafter, the residues of the titanium layer are removed by etching titanium selectively with respect to TiSi. FIG. 2H shows an example of a resulting structure. It is to be noted that the step of forming the titanium silicide layer 207 is optional and may be omitted.

Figure 2I:
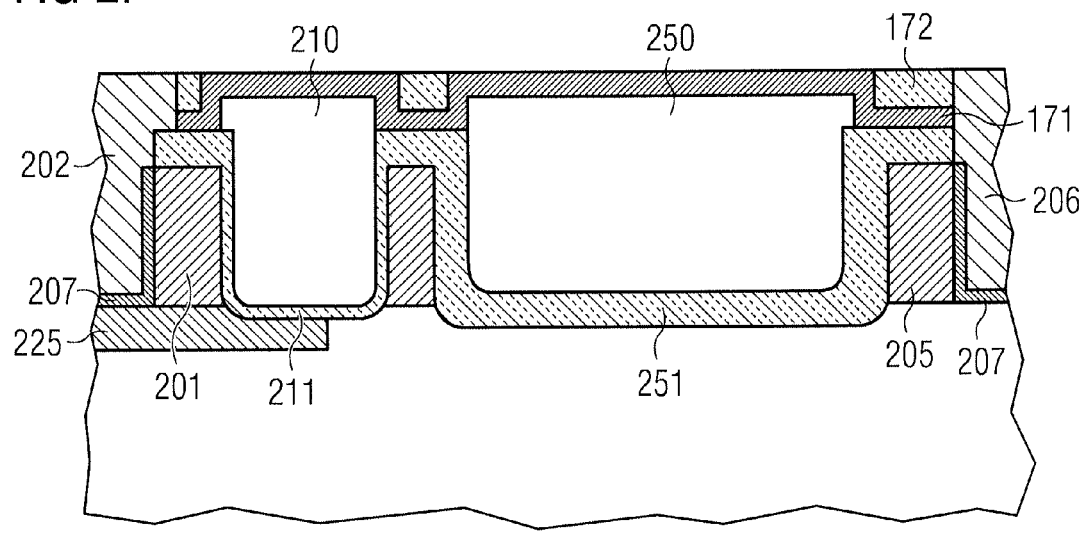
Figure 2J:
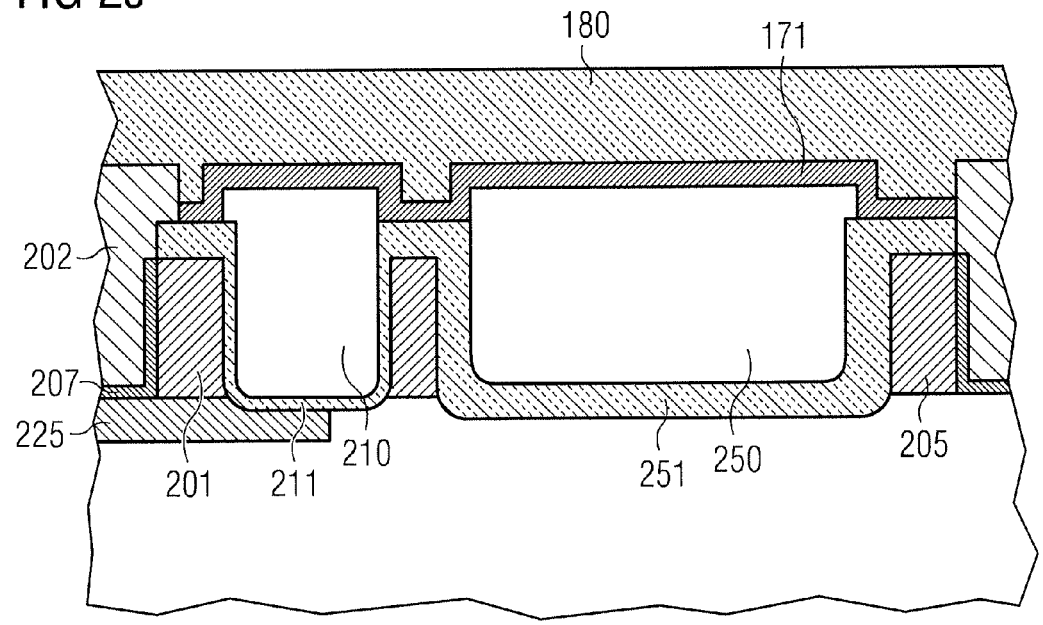

Then, further conductive layers are formed. For example, a titanium nitride layer (TiN) may be deposited, followed by a CVD step of depositing tungsten. A CMP step may be performed so as to remove tungsten and TiN from surface portions. FIG. 2I shows an example of a resulting structure. Thereafter, a further insulating layer 180 may be deposited, followed by etching steps for defining contacts to the respective portions. Then, further steps for completing the semiconductor device are performed. FIG. 2J shows an example of a resulting structure.

As has been described, one mask may be used for defining the gate trenches 212 and the contact grooves 203, 204. As a result, the gate electrode and the source region or the drain region may be formed in a self-aligned manner. Further, since the gate trenches and the field plate trenches are formed by separate etching steps, the dielectric layer 182 need not to be removed from the gate trench 212. This improves the process for manufacturing the semiconductor device. Since an etching step may only remove portions of the dielectric layer 182 from the regions where the gate trenches 212 are to be etched, a portion of the silicon oxide layer 182 remains over the channel region 220 and the source region 201. Hence, the surface of the work piece 1 has an increased planarity and the performance of the gate electrode may be improved.

In the process described above, forming the transistor by forming field plate trenches and gate trenches and, thereafter, forming a conductive layer so as to fill adjacent trenches, refers to the so-called damascene manufacturing method. According to this method, patterning the conductive layer so as to form the portions of the gate electrode adjacent to vertical sidewalls of the channel region having the shape of a first ridge, can be dispensed with. Similarly, patterning the conductive layer so as to form the portions of the field plate adjacent to vertical sidewalls of the drift zone having the shape of a second ridge, can be dispensed with. Consequently, this method further simplifies the method of manufacturing the semiconductor device.

FIG. 3A shows a cross-sectional view of a work piece 1 when performing a method according to a further embodiment. As is shown, after performing the doping process for defining the drift zone 260, a portion of the substrate surface 110 is covered by a photoresist layer 300. Then, a further doping step with p-type dopants may be performed so as to form the doped portion 301. The channel region will be defined in this doped portion 301 in a later processing step.

Figure 3B:
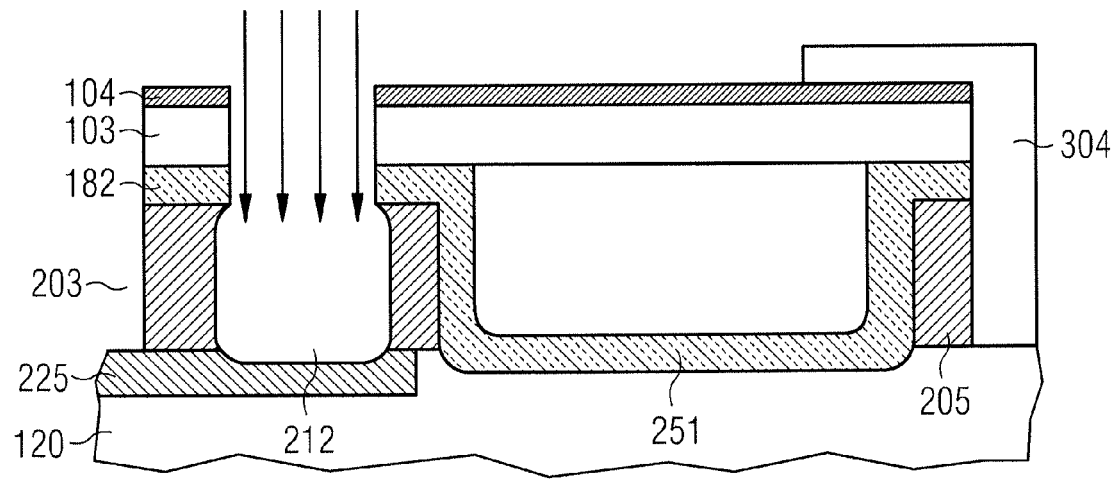
Figure 3C:
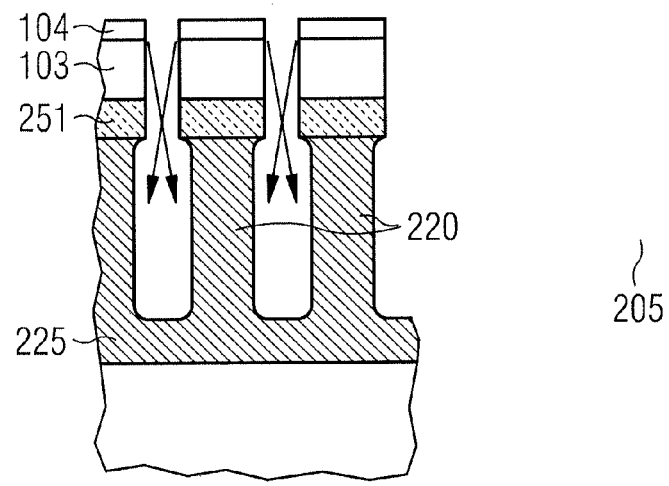

According to a further embodiment, starting from the work piece 1 shown in FIG. 2C, after etching the gate trenches 212, a doping process may be performed in order to dope the channel region 220. As is illustrated in FIG. 3B, during this doping step, the field plate trenches 252, the contact groove for contacting the drain region 205, the source region and the drain region as well as the drift zone are covered by a hard mask layer stack comprising hardmask layers 103 and 104 and the further resist material 304. Then, a tilted doping step is performed so as to dope the sidewalls of the trenches 212 forming the channel region 220 perpendicular to the shown cross-section. Further, below the gate trench 212 the body connection portion 225 is defined. FIG. 3B shows a sectional view along the line IV-IV' (cf. FIG. 1A), whereas FIG. 3C shows a sectional view in a direction perpendicular along the line II-II'.

FIG. 4A illustrates a general method of manufacturing a semiconductor device including a transistor. The method comprises forming field plate trenches S400 in a main surface of a semiconductor substrate, a drift zone being defined between adjacent field plate trenches, forming a field dielectric layer S410 in the field plate trenches, thereafter, forming gate trenches S420 in the main surface of the semiconductor substrate, a channel region being defined between adjacent gate trenches, and forming a conductive material S430 in at least some of the field plate trenches and in at least some of the gate trenches. The method further comprising forming a source region S440 and forming a drain region S450 in the main surface of the semiconductor substrate.

FIG. 4B illustrates a general method of manufacturing a semiconductor device including a transistor according to a further embodiment. The method comprises forming field plate trenches S400 in a main surface of a semiconductor substrate, a drift zone being defined between adjacent field plate trenches, forming a field dielectric layer S410 in the field plate trenches, thereafter, forming gate trenches S420 in the main surface of the semiconductor substrate, a channel region being defined between adjacent gate trenches, and forming a conductive material S430 in at least some of the field plate trenches and in at least some of the gate trenches. Each of the field plate trenches and each of the gate trenches is formed to extend in the first horizontal direction. Adjacent ones of the field plate trenches and of the gate trenches are disposed along a second horizontal direction perpendicular to the first direction.

As has been illustrated in the foregoing, embodiments of the present specification relate to a semiconductor device which is implemented as a so-called lateral device enabling a current flow approximately parallel to the first main surface 110 of the semiconductor substrate 200. Accordingly, for example, source and drain regions may be formed in an easy manner and all device components may be processed adjacent to the first main surface 110 of the substrate. The channel region 220 has the shape of a ridge, thus implementing a three-dimensional structure. The gate electrode 210 is disposed in gate trenches 212 extending along the whole depth of the channel region 220. Accordingly, control of a conductive channel formed in the channel region 220 may be accomplished over the whole depth of the transistor. Moreover, due to the presence of the field plate 250, charge compensation in the drift zone 260 by means of the field plate 250 is accomplished. The field plate 250 is disposed in a field plate trench 252 extending in the depth direction of the substrate. Accordingly, in an off-state, depletion of charge carriers in the drift zone 260 with the field plate 250 may be easily and effectively accomplished. According to the embodiment in which the channel region 220 has the shape of a ridge having a special width, the transistor may be fully depleted when a gate voltage corresponding to an on-state is applied. Thereby, a transistor having improved sub-threshold slope characteristics is implemented. Further, the effective transistor width is increased, so that the effective area of the transistor is increased without increasing the space that is required. Due to the special manufacturing method, the gate trenches 212 and the source contact groove 203 may be formed by joint processing methods. Accordingly, gate electrode 210 and the source contact 202 may be formed in a self-aligned manner. Further, the gate trenches 212 and the drain contact groove 204 may be formed by joint processing methods. As a result, the gate electrode 210 and the drain contact 206 may be formed in a self-aligned manner.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. A method of manufacturing a semiconductor device including a transistor, comprising:

forming field plate trenches in a main surface of a semiconductor substrate, a drift zone being defined between adjacent field plate trenches;

forming a field dielectric layer in the field plate trenches;

thereafter, forming gate trenches in the main surface of the semiconductor substrate, a channel region being defined between adjacent gate trenches; and forming a conductive material in at least some of the field plate trenches and in at least some of the gate trenches, the method further comprising forming a source region and forming a drain region in the main surface of the semiconductor substrate.

2. The method according to claim 1, wherein the source region and the drain region are arranged along a first horizontal direction, the field plate trenches and the gate trenches are formed between the source region and the drain region, at least one of the field plate trenches and at least one of the gate trenches being arranged along the first horizontal direction.

3. The method according to claim 1, further comprising forming a source contact in contact with the source region, wherein forming the source contact comprises forming a source contact groove in the main surface.

4. The method according to claim 3, wherein the source contact groove is formed in a self-aligned manner with respect to the gate trenches.

5. The method according to claim 3, wherein the source contact groove and the gate trenches are formed by a joint etching process.

6. The method according to claim 3, wherein the source contact groove and the gate trenches extend to approximately the same depth.

7. The method according to claim 1, further comprising doping the channel region.

8. The method according to claim 7, wherein the doping process for forming the channel region is performed before forming the field plate trenches.

9. The method according to claim 7, wherein the doping process for forming the channel region is performed after forming the gate trenches and before forming the conductive material in the gate trenches.

10. The method according to claim 7, wherein the doping process for forming the channel region is performed after forming the conductive material in the gate trenches.

11. The method according to claim 10, wherein the doping process for forming the channel region comprises a tilted ion implantation process.

12. The method according to claim 11, wherein the tilted ion implantation process is followed by a further tilted ion implantation process for defining a source region.

13. The method according to claim 1, wherein each of the field plate trenches and each of the gate trenches is formed to extend in the first horizontal direction, adjacent ones of the field plate trenches and of the gate trenches being disposed along a second horizontal direction perpendicular to the first direction.

14. The method according to claim 13, wherein a width d of the channel region (220) formed between adjacent gate trenches fulfills d≤2×ld, wherein ld denotes a length of a depletion zone formed at an interface between the channel region and the gate electrode, the width d being measured in a horizontal direction perpendicular to the first direction.

15. A method of manufacturing a semiconductor device including a transistor, comprising:

forming field plate trenches in a main surface of a semiconductor substrate, a drift zone being defined between adjacent field plate trenches;

forming a field dielectric layer in the field plate trenches;
thereafter, forming gate trenches in the main surface of the semiconductor substrate, a channel region being defined between adjacent gate trenches; and
forming a conductive material in at least some of the field plate trenches and in at least some of the gate trenches,
wherein each of the field plate trenches and each of the gate trenches is formed to extend in the first horizontal direction, adjacent ones of the field plate trenches and of the gate trenches being disposed along a second horizontal direction perpendicular to the first direction.

\* \* \* \* \*